US012727088B2

(12) United States Patent
Jeong et al.

(10) Patent No.: US 12,727,088 B2
(45) Date of Patent: Sep. 1, 2026

(54) PRINTED CIRCUIT BOARD

(71) Applicant: SAMSUNG ELECTRO-MECHANICS CO., LTD., Suwon-si (KR)

(72) Inventors: Sang Ho Jeong, Suwon-si (KR); Jong Eun Park, Suwon-si (KR); Chang Hwa Park, Suwon-si (KR); Hyun Hu Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 210 days.

(21) Appl. No.: 18/632,794

(22) Filed: Apr. 11, 2024

(65) Prior Publication Data

US 2025/0056727 A1 Feb. 13, 2025

(30) Foreign Application Priority Data

Aug. 10, 2023 (KR) ........................ 10-2023-0104624

(51) Int. Cl.
*H05K 1/183* (2026.01)
*H05K 1/02* (2006.01)
*H05K 1/11* (2006.01)

(52) U.S. Cl.
CPC ........... *H05K 1/183* (2013.01); *H05K 1/0298* (2013.01); *H05K 1/115* (2013.01); *H05K 2201/09827* (2013.01)

(58) Field of Classification Search
CPC ............................ H05K 1/183; H05K 1/0298
USPC ........................................................ 361/762
See application file for complete search history.

(56) References Cited

U.S. PATENT DOCUMENTS

2014/0202740 A1* 7/2014 Maeda .................... H05K 1/09 174/251
2019/0252306 A1 8/2019 Park
2020/0118840 A1 4/2020 Beyne
2020/0275552 A1* 8/2020 Wu ........................ H05K 3/146
2021/0068261 A1* 3/2021 Cho .................... H05K 1/0298

FOREIGN PATENT DOCUMENTS

JP 2012019192 A * 1/2012 ............ H01L 24/96
KR 10-2019-0097464 A 8/2019

* cited by examiner

*Primary Examiner* — Andargie M Aychillhum
(74) *Attorney, Agent, or Firm* — Morgan, Lewis & Bockius LLP

(57) ABSTRACT

The present disclosure relates to a printed circuit board, including: a plurality of insulating layers having a through-portion; a plurality of wiring layers respectively disposed on or in the plurality of insulating layers; a plurality of via layers respectively penetrating through at least a portion of at least one of the plurality of insulating layers and respectively connected to at least one of the plurality of wiring layers; an electronic component at least partially disposed in the through-portion, and embedded in at least one of the plurality of insulating layers; and an insulating film disposed in the plurality of insulating layers, and covering at least a portion of a side surface of the electronic component and at least a portion of a wall surface of the through-portion.

20 Claims, 17 Drawing Sheets

PRINTED CIRCUIT BOARD

CROSS-REFERENCE TO RELATED APPLICATION(S)

This application claims benefit of priority to Korean Patent Application No. 10-2023-0104624 filed on Aug. 10, 2023, in the Korean Intellectual Property Office, the disclosure of which is incorporated herein by reference in its entirety.

TECHNICAL FIELD

The present disclosure relates to a printed circuit board.

The technology of embedding electronic components such as semiconductor chips and passive devices in a printed circuit board is being actively researched due to the densification of circuits, and the miniaturization and the thinning of electronic product, and a large amount of research is being conducted on a substrate structure and methodology related thereto.

On the other hand, when manufacturing a substrate, a surface treatment is usually performed to secure the adhesion between a metal layer and an insulating layer, and as a built-in electronic component is separately provided, it may not be easy to modify a surface in a substrate manufacturing operation. Accordingly, a reliability problem may arise due to a lack of adhesion between the electronic component and the insulating layer.

SUMMARY

An aspect of the present disclosure is to provide a printed circuit board that may secure reliability by improving adhesion between an electronic component embedded in a substrate and an insulating layer.

One of the various solutions proposed through the present disclosure is to form an insulating film covering at least a portion of electronic components embedded in a substrate in a substrate manufacturing process using a thin film deposition process such as Atomic Layer Deposition (ALD) and Molecular Vapor Deposition (MVD) method.

For example, according to an aspect of the present disclosure, a printed circuit board may include: a plurality of insulating layers having a through-portion; a plurality of wiring layers respectively disposed on or in the plurality of insulating layers; a plurality of via layers respectively penetrating through at least a portion of at least one of the plurality of insulating layers and respectively connected to at least one of the plurality of wiring layers; an electronic component at least partially disposed in the through-portion, and embedded in at least one of the plurality of insulating layers; and an insulating film disposed in the plurality of insulating layers, and covering at least a portion of a side surface of the electronic component and at least a portion of a wall surface of the through-portion.

For example, according to an aspect of the present disclosure, a printed circuit board may include: a plurality of insulating layers; a plurality of wiring layers respectively disposed on or in the plurality of insulating layers; a plurality of via layers respectively penetrating through at least a portion of at least one of the plurality of insulating layers and respectively connected to at least one of the plurality of wiring layers; an electronic component disposed in the plurality of insulating layers; and an insulating film disposed in the plurality of insulating layers and covering at least a portion of at least one portion of the plurality of wiring layers and at least a portion of the electronic component.

An effect of the present disclosure is to provide a printed circuit board that may secure reliability by improving adhesion between an electronic component embedded in a substrate and an insulating layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
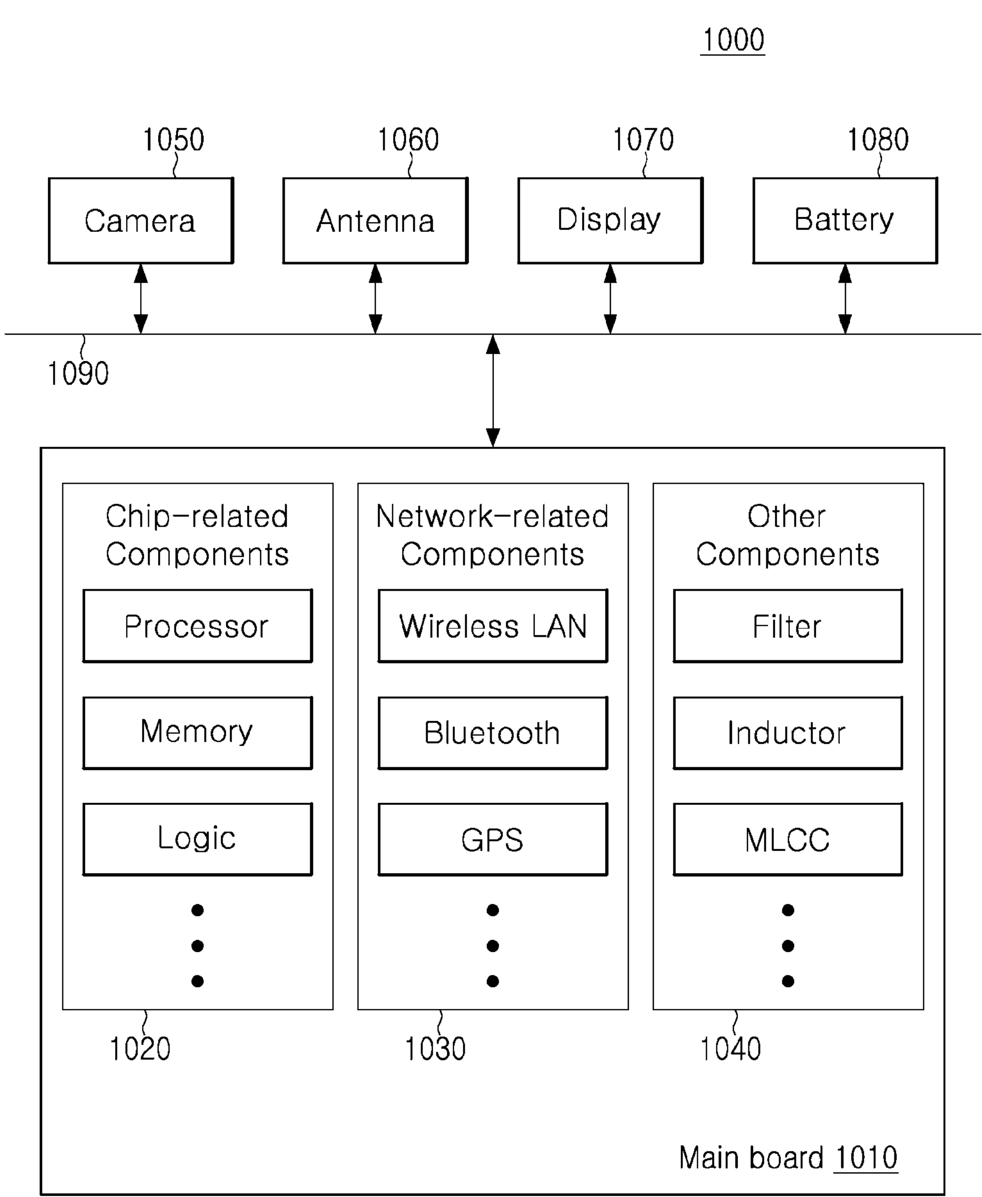
FIG. 1 is a block diagram schematically illustrating an example embodiment of an electronic device system.

Hereinafter, the present disclosure will be described with reference to the accompanying drawings. In the drawings, the shape and size of the elements may be exaggerated or reduced for clearer description.

Electronic Device

FIG. 1 is a block diagram schematically illustrating an example embodiment of an electronic device system.

Referring to FIG. 1, an electronic device 1000 accommodates a main board 1010 therein. Chip-related components 1020, network-related components 1030, and other components 1040, and the like, are physically and/or electrically connected to the main board 1010. These components are also coupled to other electronic components to be described below to form various signal lines 1090.

The chip-related components 1020 may include a memory chip such as a volatile memory (e.g., a DRAM), a non-volatile memory (e.g., a ROM), a flash memory, or the like; an application processor chip such as a central processor (e.g., a CPU), a graphics processor (e.g., a GPU), a digital signal processor, a cryptographic processor, a microprocessor, a microcontroller, or the like; and a logic chip such as an analog-to-digital (ADC) converter, an application-specific IC (ASIC), or the like. However, the chip-related components 1020 are not limited thereto, and may also include other types of chip-related electronic components. Furthermore, the chip-related components 1020 may be coupled to each other. The chip-related component 1020 may have the form of a package including the above-described chip or electronic component.

The network-related components 1030 may include wireless fidelity (Wi-Fi) (such as IEEE 802.11 family), worldwide interoperability for microwave access (WiMAX) (such as IEEE 802.16 family), IEEE 802.20, long term evolution (LTE), evolution data only (Ev-DO), HSPA+, HSDPA+, HSUPA+, EDGE, GSM, GPS, GPRS, CDMA, TDMA, DECT, Bluetooth, 3G, 4G, and 5G protocols, and any other wireless and wired standards or protocols specified thereafter. However, the network-related components 1030 are not limited thereto, and may also include any of a number of other wireless or wired standards or protocols. Furthermore, the network-related components 1030 may be coupled to the chip-related components 1020.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), or the like. However, other components are not limited thereto, and may also include passive components in the form of chip components used for various other purposes. In addition, other components 1040 may be coupled to each other, together with the chip-related components 1020 and/or the network-related components 1030.

Depending on a type of electronic device 1000, the electronic device 1000 may include other electronic components that may or may not be physically and/or electrically connected to main board 1010. These other electronic components may include, for example, a camera module 1050, an antenna module 1060, a display 1070, and a battery 1080. However, these other electronic components are not limited thereto, but may also include an audio codec, a video codec, a power amplifier, a compass, an accelerometer, a gyroscope, a speaker, a mass storage device (e.g., a hard disk drive), a compact disk (CD), a digital versatile disk (DVD), or the like. In addition thereto, other electronic components used for various purposes depending on a type of electronic device 1000 may be included.

The electronic device 1000 may be a smartphone, a personal digital assistant, a digital video camera, a digital still camera, a network system, a computer, a monitor, a tablet PC, a laptop PC, a netbook PC, a television, a video game machine, a smartwatch, an automotive component. However, the electronic device 1000 is not limited thereto, and may be any other electronic device that processes data in addition thereto.

Figure 2:
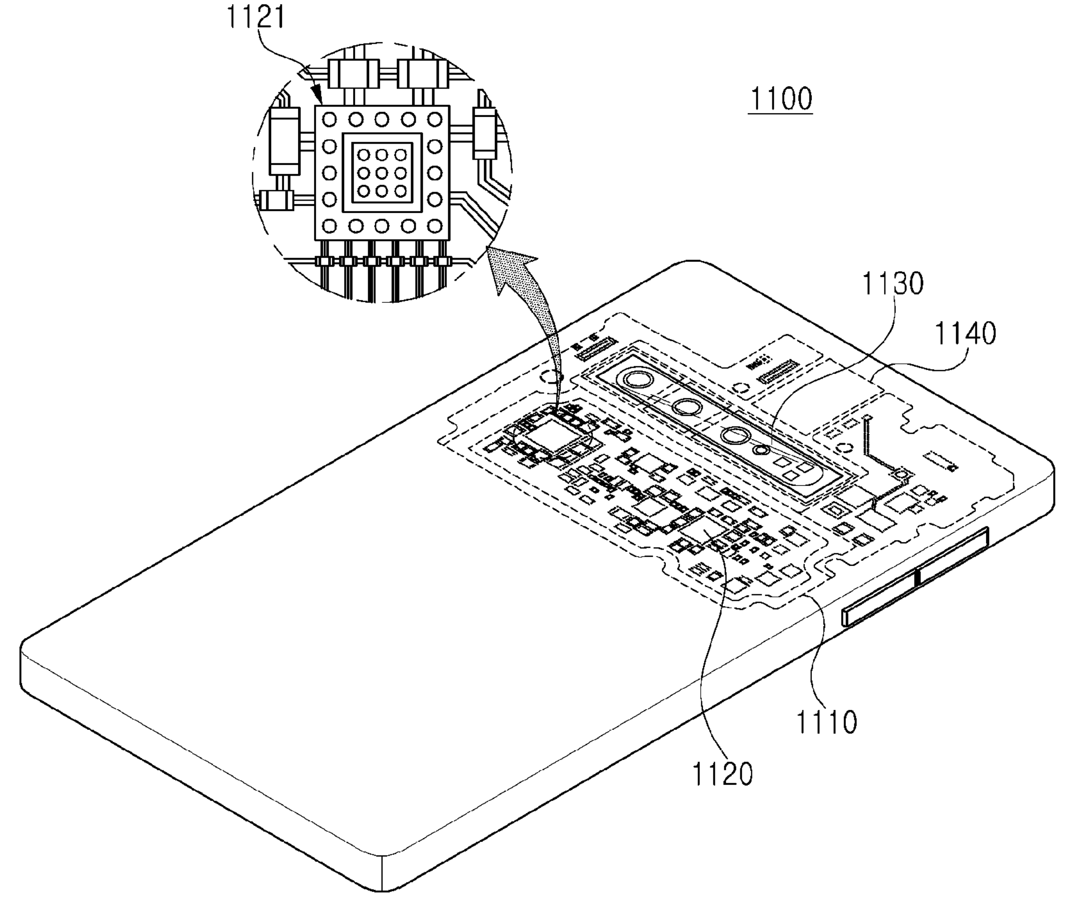
FIG. 2 is a perspective view schematically illustrating an example embodiment of an electronic device.

FIG. 2 is a perspective view schematically illustrating an example embodiment of an electronic device.

Referring to FIG. 2, an electronic device may be, for example, a smartphone 1100. A motherboard 1110 may be accommodated in the smartphone 1100, and various components 1120 may be physically and/or electrically connected to the motherboard 1110. Furthermore, other components that may or may not be physically and/or electrically connected to the motherboard 1110, such as a camera module 1130 and/or a speaker 1140, may be accommodated in the smartphone 1100. Some of the components 1120 may be the chip-related components described above, for example, the component package 1121, but the present disclosure is not limited thereto. The component package 1121 may have the form of a printed circuit board in which an electronic component including an active component and/or a passive component is mounted on a surface. Alternatively, the component package 1121 may have the form of a printed circuit board in which an active component and/or a passive component are embedded. On the other hand, the electronic device is not necessarily limited to the smartphone 1100, and may be other electronic devices as described above.

Printed Circuit Board

Figure 3:
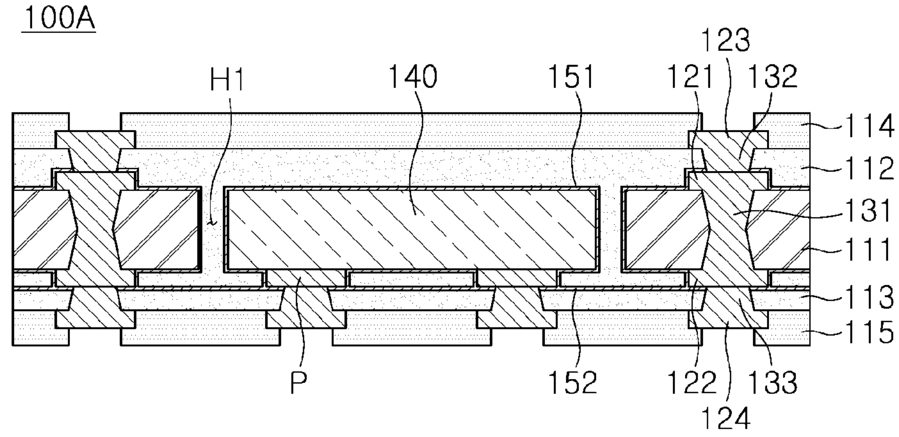
FIG. 3 is a cross-sectional view schematically illustrating an example embodiment of a printed circuit board.

FIG. 3 is a cross-sectional view schematically illustrating an example embodiment of a printed circuit board.

Referring to FIG. 3, a printed circuit board 100A according to an example embodiment may include a plurality of insulating layers 111, 112, 113, 114 and 115, a plurality of wiring layers 121, 122, 123 and 124 respectively disposed on or in the plurality of insulating layers 111, 112, 113, 114 and 115, a plurality of via layers 131, 132 and 133 respectively penetrating through at least a portion of at least one of the plurality of insulating layers 111, 112, 113, 114 and 115 and respectively connected to at least one of the plurality of wiring layers 121, 122, 123 and 124, an electronic component 140 disposed in the plurality of insulating layers 111, 112, 113, 114 and 115, and insulating films 151 and 152 disposed in the plurality of insulating layers 111, 112, 113, 114 and 115 and covering at least a portion of each of at least one of the plurality of insulating layers 111, 112, 113, 114 and 115, and at least one of the plurality of wiring layers 121, 122, 123 and 124, and the electronic component 140. The plurality of insulating layers 111, 112, 113, 114, and 115 may have a through-portion H1, and at least a portion of the electronic component 140 may be disposed in the through-portion H1 and may be embedded in at least one of the plurality of insulating layers 111, 112, 113, 114 and 115. The insulating films 151 and 152 may cover at least a portion of each of at least a side surface of the electronic component 140 and a wall surface of the through-portion H1.

The plurality of insulating layers 111, 112, 113, 114 and 115 may include a first insulating layer 111 having a through-portion H1, a second insulating layer 112 respectively covering at least a portion of each of the first insulating layer 111 and the electronic component 140 and filling at least a portion of the through-portion H1, and a third insulating layer 113 disposed on a lower surface of the second insulating layer 112. The through-portion H1 may include a through-cavity H1 penetrating through a first insulating layer 111. The plurality of wiring layers 121, 122, 123 and 124 may include first and second wiring layers 121 and 122 respectively disposed on an upper surface and a lower surface of the first insulating layer 111, a third wiring layer 123 disposed on an upper surface of a second insulating layer 112, and a fourth wiring layer 124 disposed on a lower surface of the third insulating layer 113. The plurality of via layers 131, 132 and 133 may include a first via layer 131 penetrating through at least a portion of the first insulating layer 111, a second via layer 132 penetrating through at least a portion of the second insulating layer 112, and a third via layer 133 penetrating through at least a portion of the third insulating layer 113.

The electronic component 140 may have a front surface on which a pad P is disposed, and a back surface opposite thereto, and the electronic component 140 may be disposed so that the front surface faces downwardly. The insulating films 151 and 152 may include first and second insulating films 151 and 152. The first and second insulating films 151 and 152 may be connected to each other. The first and second insulating films 151 and 152 may be coating layers formed using a thin film deposition method, such as an Atomic Layer Deposition (ALD) method or a Molecular Vapor Deposition (MVD) method. For example, each of the first and second insulating films 151 and 152 may include a thin film with a thickness of less than 100 nm, for example, about 1 nm to 10 nm thick, and the thin film may be an alumina film, for example, an oxide film containing $Al_2O_3$. However, the present disclosure is not limited thereto, and may be an oxide film including $TiO_2$, ZnO, $SiO_2$, and the like. The first insulating film 151 may cover at least a portion of each of an upper surface and a lower surface of the first insulating layer 111, a wall surface of the through-cavity H1, an upper surface and a side surface of the first wiring layer 121, a side surface of the second wiring layer 122, and a front surface and a side surface of the electronic component 140, with a substantially constant thickness. The second insulating film 152 may cover at least a portion of each of a lower surface of the second insulating layer 112 and a lower surface of the second wiring layer 122, with a substantially constant thickness. The second insulating layer 112 may cover at least a portion of the first insulating film 151, and the third insulating layer 113 may cover at least a portion of the second insulating film 152.

In this manner, in the printed circuit board 100A according to an example embodiment, the first and second insulating films 151 and 152 may cover at least a portion of each of the electronic component 140, the first insulating layer 111, and the wall surface of the through-cavity H1, and the first and second wiring layers 121 and 122, and may be at least partially disposed between the above-described components and the second and third insulating layers 112 and 113. In this case, the first and second insulating films 151 and 152 may have excellent adhesion to the second and third insulating layers 112 and 113, and thus may be used as an adhesion auxiliary layer. Accordingly, reliability may be secured by improving adhesion between the electronic component 140, the first insulating layer 111, the wall surface of the through-cavity H1, the first and second wiring layers 121 and 122, and the like, and the second and third insulating layers 112 and 113.

Hereinafter, components of the printed circuit board 100A according to an example embodiment will be described in more detail with reference to the drawings.

Each of the first to third insulating layers 111, 112 and 113 may include an insulating material. The insulating material may include a thermosetting resin such as an epoxy resin, a thermoplastic resin such as polyimide, or a material including an inorganic filler, an organic filler, and/or a glass fiber (Glass Fiber, Glass Cloth or Glass Fabric) along with resins. For example, the insulating material may be a non-photosensitive insulating material such as Copper Clad Laminate (CCL), an Ajinomoto Build-up Film (ABF), or Prepreg (PPG), but the present disclosure is not limited thereto, and other polymer materials may be used. Additionally, the insulating material may be a photosensitive insulating material such as Photoimageable Dielectric (PID). As a non-limiting example, the first insulating layer 111 may include CCL, and the second and third insulating layers 112 and 113 may include the ABF or the PPG, respectively, but the present disclosure is not limited thereto. The first insulating layer 111 may be a core layer, and each of the second and third insulating layers 112 and 113 may be a build-up layer. Boundaries of the first and second insulating layers 111 and 112 may be separated from each other through a second insulating film 152.

Each of the fourth and fifth insulating layers 114 and 115 may include a liquid or film-type solder resist, but the present disclosure is not limited thereto, and may include other types of insulating materials such as ABF. Each of the fourth and fifth insulating layers 114 and 115 may have openings exposing at least a portion of the third and fourth wiring layers 123 and 124, respectively, and a surface treatment layer may be formed on an exposed pattern as needed.

Each of the first to fourth wiring layers 121, 122, 123 and 124 may include a metallic material. The metallic material may include copper (Cu), aluminum (Al), silver (Ag), tin (Sn), gold (Au), nickel (Ni), lead (Pb), titanium (Ti), and/or alloys thereof. The metallic material may include, preferably, copper (Cu), but the present disclosure is not limited thereto. Each of the first to fourth wiring layers 121, 122, 123 and 124 may perform various functions depending on the design. For example, the first to fourth wiring layers 121, 122, 123 and 124 may include a signal pattern, a power pattern, and a ground pattern. Each of these patterns may have various forms such as a line, a plane, and a pad. Each of the first to fourth wiring layers 121, 122, 123 and 124 may include an electroless plating layer (or chemical copper) and an electrolytic plating layer (or electrical copper). Alternatively, each of the first to fourth wiring layers 121, 122, 123 and 124 may include a metal foil (or copper foil) and an electrolytic plating layer (or electrolytic copper). Alternatively, the first to fourth wiring layers 121, 122, 123 and 124 may include a metal foil (or copper foil), an electroless plating layer (or chemical copper), and an electrolytic plating layer (or electrolytic copper). The first to fourth wiring layers 121, 122, 123 and 124 may include a sputtering layer instead of an electroless plating layer (or chemical copper), and may include both the sputtering layer and the electroless plating layer (or chemical copper).

Each of the first to third via layers 131, 132 and 133 may include a metallic material. The metal material may include copper (Cu), aluminum (Al), silver (Ag), tin (Sn), gold (Au), nickel (Ni), lead (Pb), titanium (Ti), and/or alloys thereof. The metal material may include, preferably, copper (Cu), but the present disclosure is not limited thereto. The first via layer 131 may include a through-via. Each of the second and third via layers 132 and 133 may include a micro via. The micro via may be a filled via filling a via hole or a conformal via disposed along a wall surface of the via hole. The micro via may be disposed in a stacked type and/or a staggered type. Vias of the first to third via layers 131, 132 and 133 may perform various functions depending on the design of a corresponding layer. For example, the first to third via layers 131, 132 and 133 may include a ground via, a power via, and a signal via. Each of the first to third via layers 131, 132 and 133 may include an electroless plating layer (or chemical copper) and an electrolytic plating layer (or electrolytic copper), but the present disclosure is not limited thereto. The first to third via layers 131, 132 and 133 may have a sputtering layer formed therein instead of an electroless plating layer, and may include both the sputtering layer and the electroless plating layer. The first via layer 131 may have a cylindrical shape or an hourglass shape, and the second and third via layers 132 and 133 may have a shape tapered in opposite directions, but the present disclosure is not limited thereto.

The electronic component 140 may be a chip-type component and may be an active component or a passive component. For example, the electronic component 140 may be an active component including a memory chip such as a volatile memory (e.g., DRAM), a non-volatile memory (e.g., ROM), a flash memory, or the like; an application processor chip such as a central processor (e.g., CPU), a graphics processor (e.g., GPU), a digital signal processor, a cryptographic processor, a microprocessor, a microcontroller, or the like; and a logic chip such as an analog-to-digital converter, an application-specific IC (ASIC), or the like. Alternatively, the electronic component 140 may be a passive component such as a high-frequency inductor, a ferrite inductor, a power inductor, ferrite beads, low temperature co-firing ceramics (LTCC), an electromagnetic interference (EMI) filter, multilayer ceramic condenser (MLCC), or the like. In the case of the active component, the front surface on which the pad P is disposed may be an active surface, and a back surface on an opposite side may be an inactive surface. In the case of the passive component, an external electrode may be disposed instead of the pad P, and the external electrode may include first and second electrodes respectively disposed at both ends in a longitudinal direction, but the present disclosure is not limited thereto and external electrodes may be formed in various forms.

As described above, each of the first and second insulating films 151 and 152 may include a thin film having a thickness of less than 100 nm, for example, a thickness of about 1 nm to 10 nm, and as described above, the thin film may be an alumina film, such as an oxide film including $Al_2O_3$, but the present disclosure is not limited thereto, and alternatively, the thin film may be an oxide film including $TiO_2$, ZnO, and/or $SiO_2$. The first and second insulating films 151 and 152 may include substantially the same materials. The first and second insulating films 151 and 152 may be first and second adhesion auxiliary layers, respectively. If necessary, additional insulating films may be formed on an upper surface of the second insulating layer 112 and a lower surface of the third insulating layers 113, and these insulating films may be formed on the second and third insulating layers 112 and 113, and at least a portion of these insulating layers may be disposed between the second and third insulating layers 112 and 113 and the third and fourth wiring layers 123 and 124, respectively, and may be used as an adhesion auxiliary layer.

FIGS. 4A to 4J are process cross-sectional views schematically illustrating an example embodiment of a manufacturing process of the printed circuit board of FIG. 3.

Figure 4A:
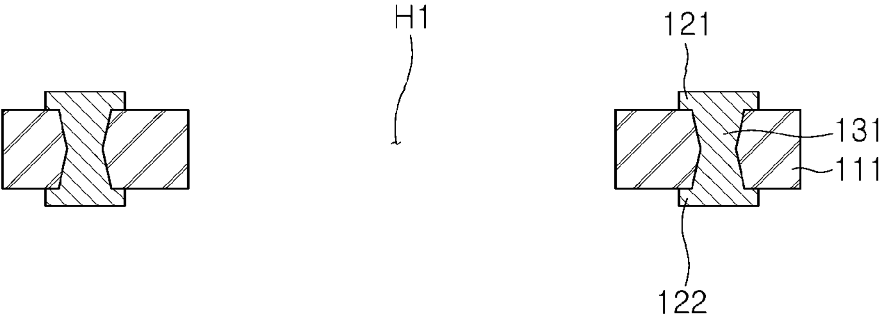
FIGS. 4A to 4J are process cross-sectional views schematically illustrating an example embodiment of a manufacturing process of the printed circuit board of FIG. 3.

Referring to FIG. 4A, a first insulating layer 111 is prepared using CCL, or the like, a through-cavity H1, first and second wiring layers 121 and 122, and a first via layer 131 are formed in the first insulating layer 111. The through-cavity H1 may be formed using mechanical drilling, laser processing, blast processing, or the like. A via hole for the first via layer 131 may also be formed using mechanical drilling, laser processing, or the like. The first and second wiring layers 121 and 122 and the first via layer 131 may be formed through a circuit formation process such as an Additive Process (AP), a Semi AP (SAP), a Modified SAP (MSAP), Tenting (TT), or the like.

Figure 4B:
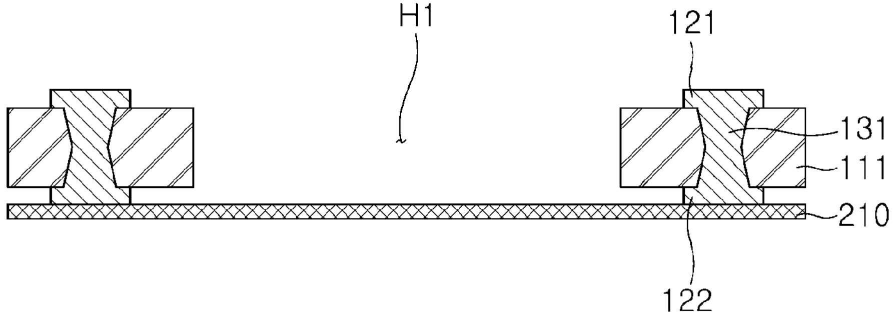

Referring to FIG. 4B, a tape 210 is attached to a lower side of the first insulating layer 111. The tape 210 may be attached to a lower surface of the second wiring layer 122. The tape 210 may block a lower portion of the through-cavity H1.

Figure 4C:
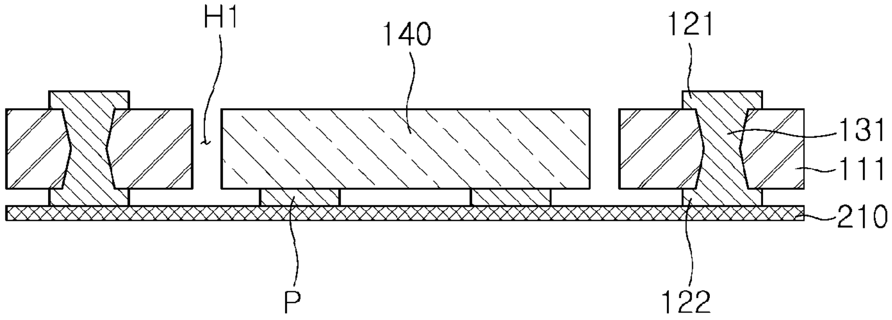

Referring to FIG. 4C, the electronic component 140 is disposed in the through-cavity H1. When the electronic component 140 is an active component, the electronic component 140 may be disposed in a face-down shape so that the front surface on which the pad P is disposed is attached to the tape 210.

Figure 4D:
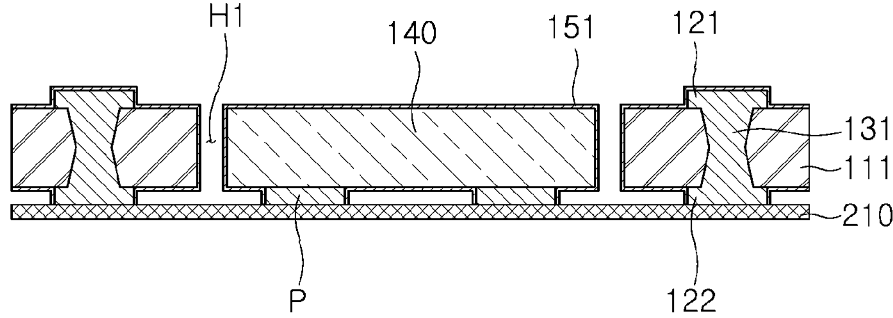

Referring to FIG. 4D, a first insulating film 151 is formed. The first insulating film 151 may be formed on the tape 210 to cover at least a portion of each of the first insulating layer 111, the first and second wiring layers 121 and 122, and the electronic component 140. The first insulating film 151 may be formed using a thin film deposition method such as ALD or MVD, as described above.

Figure 4E:
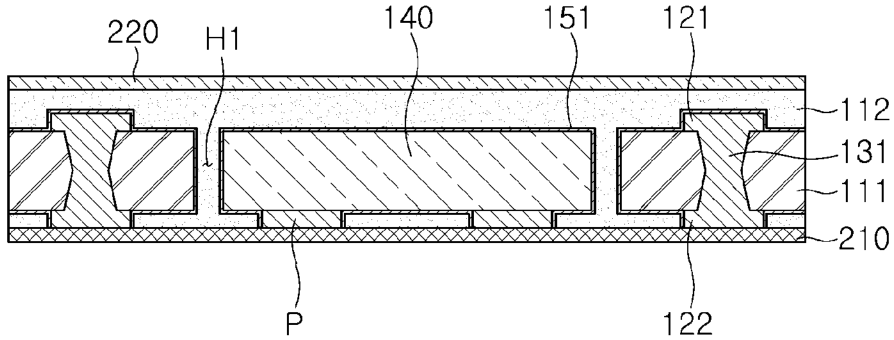

Referring to FIG. 4E, a first insulating layer 111 and a second insulating layer 112 embedding the first and second wiring layers 121 and 122 and the electronic component 140 are formed on the tape 210. The second insulating layer 112 may be formed through a lamination process while attached to a first film 220 including PolyEthylene Terephthalate (PET) or the like.

Figure 4F:
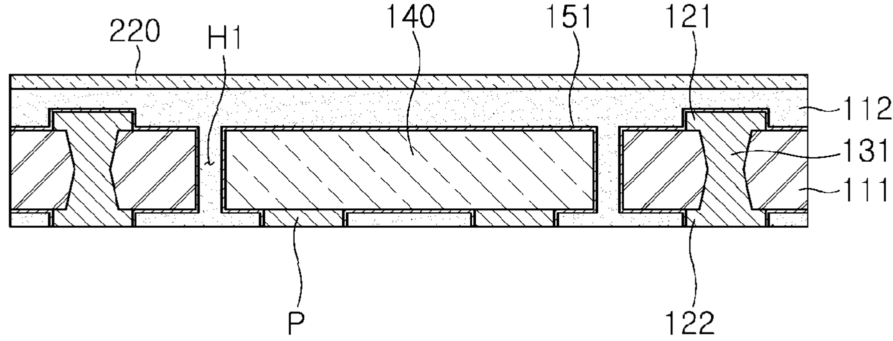

Referring to FIG. 4F, the tape 210 is removed.

Figure 4G:
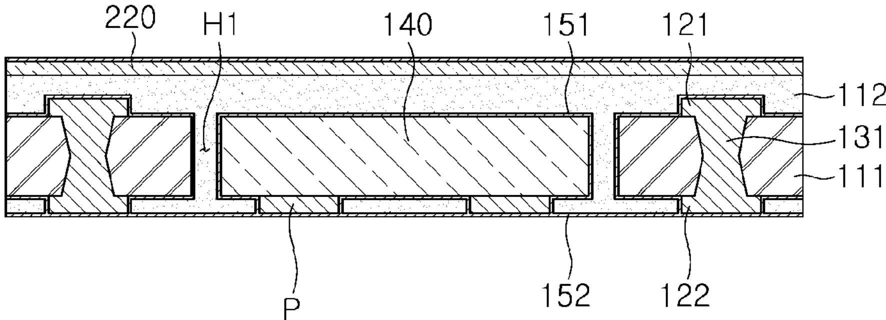

Referring to FIG. 4G, a second insulating film 152 is formed. The second insulating film 152 may be formed in a region in which the tape 210 was removed. The second insulating film 152 may be formed to cover at least a portion of each of the second insulating layer 112 and the second wiring layer 122. If necessary, the second insulating film 152 may be formed to further cover at least a portion of the pad P. When forming the second insulating film 152, an insulating film may additionally be formed on an upper surface of the first film 220. The second insulating film 152 may also be formed using a thin film deposition method such as ALD or MVD, as described above.

Figure 4H:
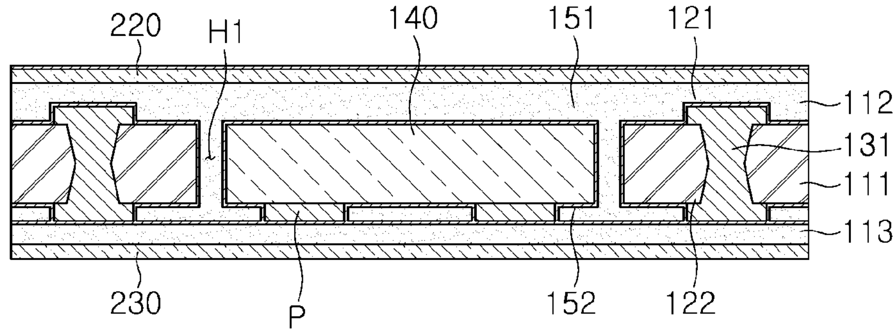

Referring to FIG. 4H, a third insulating layer 113 is formed on the second insulating film 152 to cover the second insulating film 152. The third insulating layer 113 may also be formed in a lamination process while attached to a second film 230 including PET or the like.

Figure 4I:
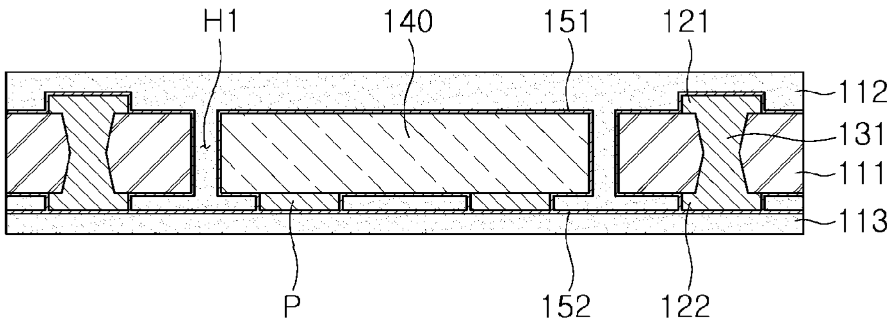

Referring to FIG. 4I, first and second films 220 and 230 are removed.

Figure 4J:
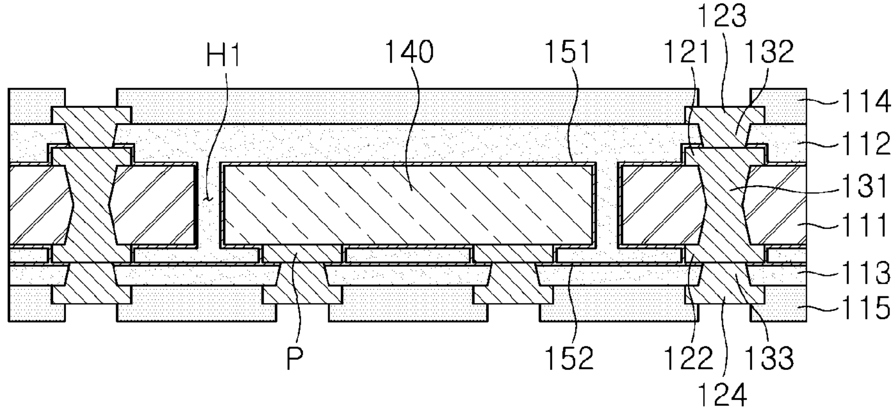

Referring to FIG. 4J, third and fourth wiring layers 123 and 124 and second and third via layers 132 and 133 are formed on the second and third insulating layers 112 and 113. Additionally, the fourth and fifth insulating layers 114 and 115 are formed using a solder resist or ABF as an outermost layer, and if necessary, openings are formed in the fourth and fifth insulating layers 114 and 115, respectively. Via holes for the second and third via layers 132 and 133 may be formed using mechanical drilling, laser processing, or the like. Each of the via holes for the second and third via layers 132 and 133 may penetrate through a portion of the first and second insulating films 151 and 152, and thus, a portion of each of the first and second wiring layers 121 and 122 may be exposed from the first and second insulating films 151 and 152. Additionally, the via hole for the second via layer 133 may penetrate through another portion of the pad P to expose the pad P from the second insulating film 152. The third and fourth wiring layers 123 and 124 and the second and third via layers 132 and 133 may be formed through the above-described circuit forming processes such as AP, SAP, MSAP, and TT.

The printed circuit board 100A according to the above-described example embodiment may be manufactured through a series of processes, and other redundant descriptions thereof will be omitted.

Figure 5:
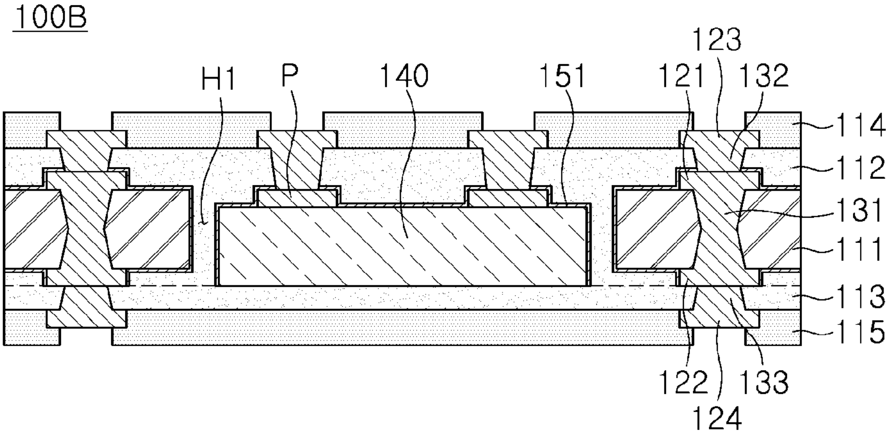
FIG. 5 is a cross-sectional view schematically illustrating another example embodiment of a printed circuit board.

FIG. 5 is a cross-sectional view schematically illustrating another example embodiment of a printed circuit board.

Referring to FIG. 5, in a printed circuit board 100B according to another example embodiment, in a case in which the electronic component 140 is an active component, the electronic component 140 may be disposed so that the front surface on which the pad P is disposed faces upwardly, as compared to the printed circuit board 100A according to the above-described example embodiment. Therefore, the first insulating film 151 may cover at least a portion of each of an upper surface and a lower surface of the first insulating layer 111, a wall surface of the through-cavity H1, an upper surface and a side surface of the first wiring layer 121, a side surface of the second wiring layer 122, and a front surface and a side surface of the electronic component 140. Additionally, the second insulating layer 112 may cover at least a portion of the first insulating film 151. Meanwhile, if necessary, the second insulating film 152 may be omitted. In this manner, even when the electronic component 140 is disposed in a face-up form, adhesion may be improved through an application of the first insulating film 151, and as a result, reliability may be improved. Other contents are substantially the same as those described above, and thus redundant descriptions thereof will be omitted.

FIGS. 6A to 6I are process cross-sectional views schematically illustrating an example embodiment of a manufacturing process of the printed circuit board of FIG. 5.

Figure 6A:
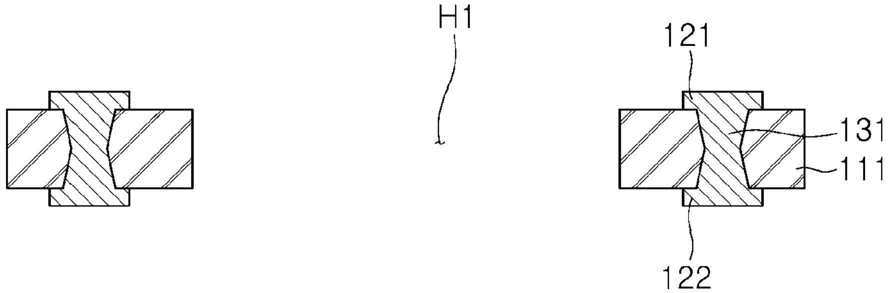
FIGS. 6A to 6I are process cross-sectional views schematically illustrating an example embodiment of a manufacturing process of the printed circuit board of FIG. 5.

Referring to FIG. 6A, as described above, a first insulating layer 111 is prepared using CCL, or the like, and a through-cavity H1, first and second wiring layers 121 and 122, and a first via layer 131 are formed in the first insulating layer 111.

Figure 6B:
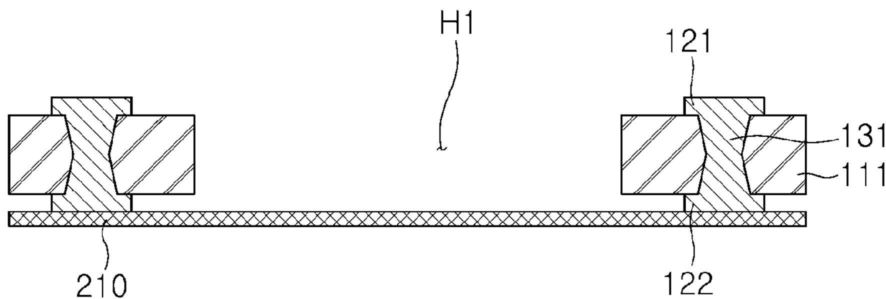

Referring to FIG. 6B, as described above, a tape 210 is attached to a lower side of the first insulating layer 111.

Figure 6C:
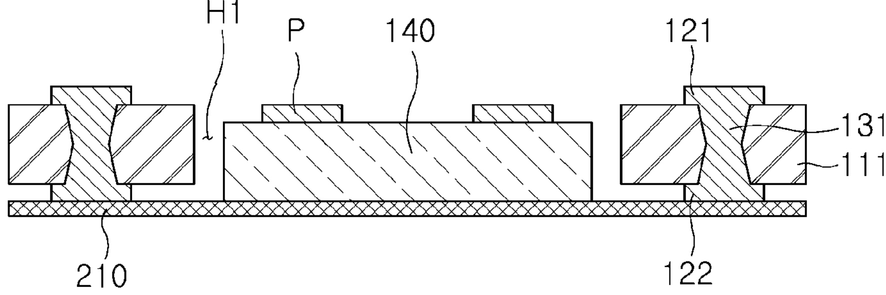

Referring to FIG. 6C, an electronic component 140 is disposed in the through-cavity H1. In this case, when the electronic component 140 is an active component, the electronic component 140 may be disposed in a face-up form so that a back surface thereof is attached to a tape 210.

Figure 6D:
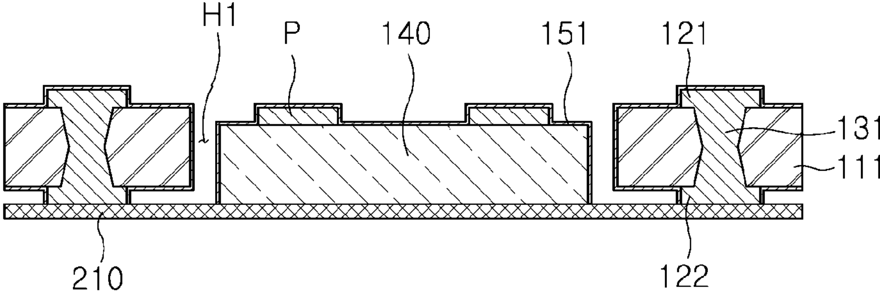

Referring to FIG. 6D, a first insulating film 151 is formed. The first insulating film 151 may be formed to cover at least a portion of the first insulating layer 111, the first and second wiring layers 121 and 122, a front surface and a side surface of the electronic component 140, and a wall surface of the through-cavity H1. If necessary, the first insulating film 151 may be formed to further cover at least a portion of a pad P. The first insulating film 151 may be formed using a thin film deposition method such as ALD, MVD or the like, as described above.

Figure 6E:
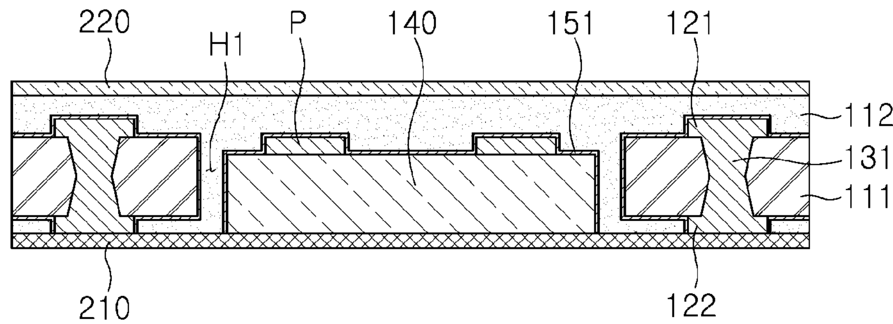

Referring to FIG. 6E, a second insulating layer 112 is formed. The second insulating layer 112 may be formed to cover at least a portion of each of the first insulating layer 111, the first and second wiring layers 121 and 122, the electronic component 140, and the first insulating film 151. As described above, the second insulating layer 112 may be formed through a lamination process while attached to the first film 220 including PET or the like.

Figure 6F:
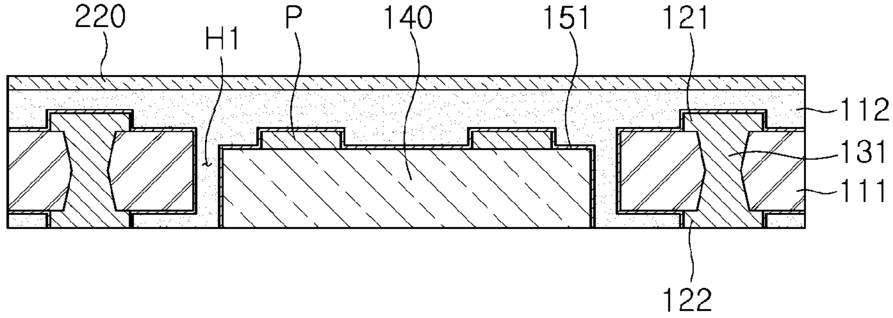

Referring to FIG. 6F, the tape 210 is removed.

Figure 6G:
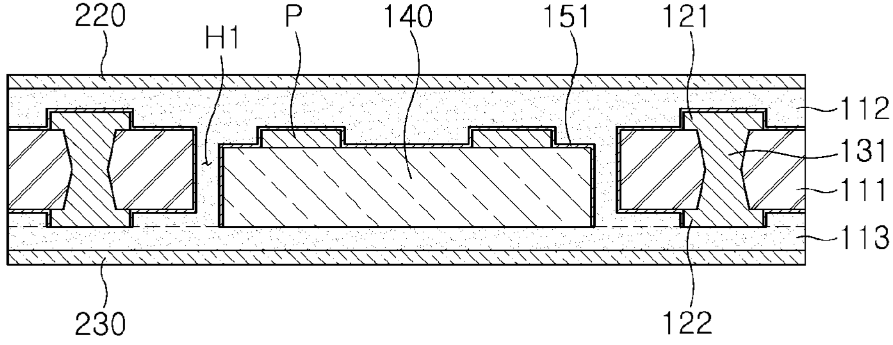

Referring to FIG. 6G, a third insulating layer 113 is formed in a region from which the tape 210 was removed. The third insulating layer 113 may be formed to cover at least a portion of lower surfaces of each of the second insulating layer 112 and the second wiring layer 122. The third insulating layer 113 may also be formed in a lamination process while attached to a second film 230 including PET or the like.

Figure 6H:
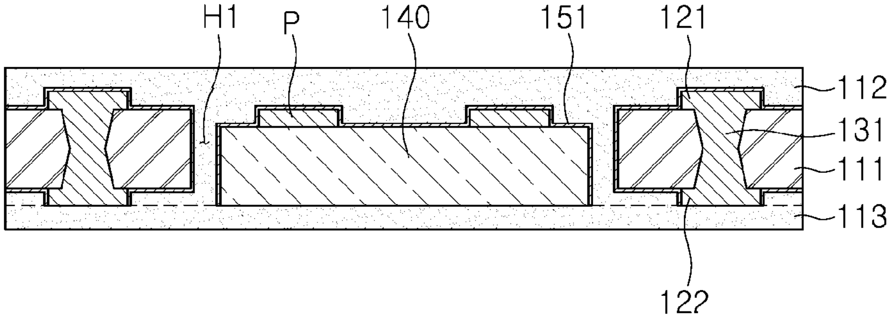

Referring to FIG. 6H, first and second films 220 and 230 are removed.

Figure 6I:
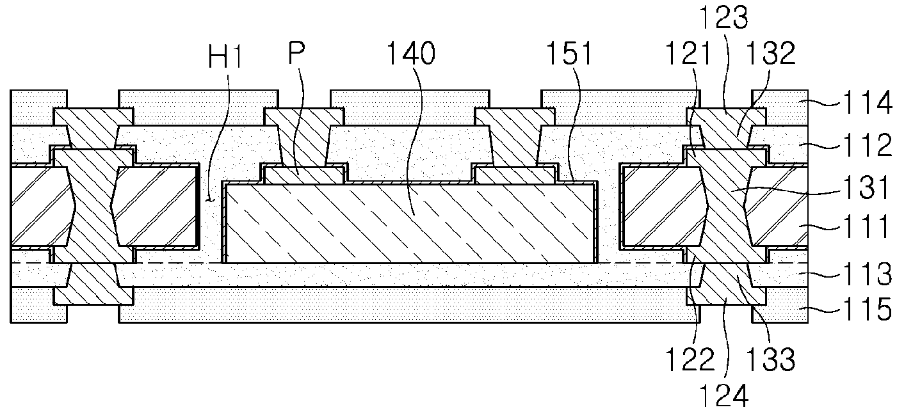

Referring to FIG. 6I, as described above, third and fourth wiring layers 123 and 124 and second and third via layers 132 and 133 are formed on the second and third insulating layers 112 and 113. Additionally, fourth and fifth insulating layers 114 and 115 are formed using a solder resist or ABF as an outermost layer, and if necessary, openings are formed in the fourth and fifth insulating layers 114 and 115, respectively. Via holes for the second and third via layers 132 and 133 may be formed using mechanical drilling, laser processing, or the like. The via hole for the second via layer 132 may penetrate through a portion of the first insulating film 151, and thus a portion of each of the first wiring layer 121 and the pad P may be exposed from the first insulating film 151. The third and fourth wiring layers 123 and 124 and the second and third via layers 132 and 133 may be formed in the circuit formation process described above.

A printed circuit board 100B according to another example embodiment described above may be manufactured in a series of processes, and other redundant descriptions will thereof be omitted.

Figure 7:
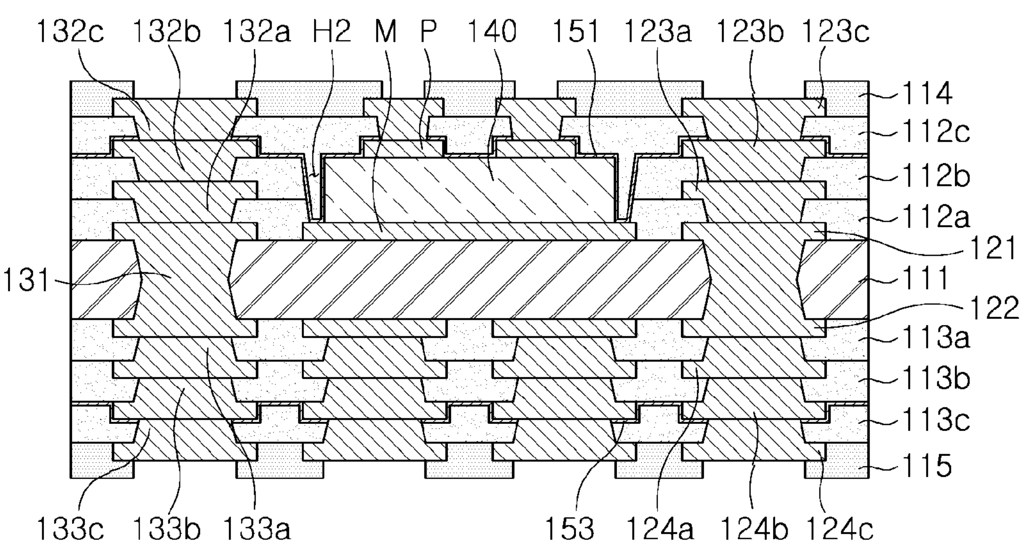
FIG. 7 is a cross-sectional view schematically illustrating another example embodiment of a printed circuit board.

FIG. 7 is a cross-sectional view schematically illustrating another example embodiment of a printed circuit board.

Referring to FIG. 7, in a printed circuit board 100C according to another example embodiment, a through-portion H2 may include at least one of a plurality of second insulating layers 112*a*, 112*b* and 112*c* other than a first insulating layer 111, for example, a blind cavity H2 penetrating through second-first and second-second insulating layers 112*a* and 112*b* with a stopper layer M disposed on a bottom surface thereof, as compared to the printed circuit board 100A according to the above-described example embodiment and the printed circuit board 100B according to another example embodiment. A plurality of insulating layers 111, 112*a*, 112*b*, 112*c*, 113*a*, 113*b*, 113*c*, 114 and 115 may include a first insulating layer 111, a plurality of second insulating layers 112*a*, 112*b* and 112*c* disposed on an upper surface of the first insulating layer 111 and having a through-portion H2, a plurality of third insulating layers 113*a*, 113*b* and 113*c* disposed on a lower surface of the first insulating layer 111, and fourth and fifth insulating layers 114 and 115 respectively disposed on an uppermost side and a lowermost side. A plurality of wiring layers 121, 122, 123*a*, 123*b*, 123*c*, 124*a*, 124*b* and 124*c* may include first and second wiring layers 121 and 122 respectively disposed on an upper surface and a lower surface of the first insulating layer 111, a plurality of third wiring layers 123*a*, 123*b* and 123*c* respectively disposed on the plurality of second insulating layers 112*a*, 112*b* and 112*c*, and a plurality of fourth wiring layers 124*a*, 124*b* and 124*c* respectively disposed on the plurality of third insulating layers 113*a*, 113*b* and 113*c*. A plurality of via layers 131, 132*a*, 132*b*, 132*c*, 133*a*, 133*b* and 133*c* may include a first via layer 131 penetrating through at least a portion of the first insulating layer 111, a plurality of second via layers 132*a*, 132*b* and 132*c* penetrating through at least a portion of each of the plurality of second insulating layers 112*a*, 112*b* and 112*c*, and a plurality of third via layers 133*a*, 133*b* and 133*c* penetrating through at least a portion of each of the plurality of third insulating layers 113*a*, 113*b* and 113*c*. The blind cavity H2 may penetrate through at least one of the plurality of second insulating layers 112*a*, 112*b* and 112*c*, for example, second-first and second-second insulating layers 112*a* and 112*b*. A second-third insulating layer 112*c* may fill at least a portion of the blind cavity H2. The first wiring layer 121 may include a stopper layer M providing a bottom surface of the blind cavity H2. When the electronic component 140 is an active component, the electronic component 140 may be disposed so that a front surface on which a pad P is disposed faces upwardly. For example, a back surface of the electronic component 140 may be attached to the stopper layer M using an adhesive such as a Die Attach Film (DAF). The insulating films 151 and 153 may include first and third insulating films 151 and 153 disposed to be spaced apart from each other. The first insulating film 151 may cover at least one of a plurality of second insulating layers 112*a*, 112*b* and 112*c*, for example, at least one of an upper surface of a second-second insulating layer 112*b*, a wall surface of the blind cavity H2, an upper surface of the stopper layer M and the third wiring layer 123*a*, 123*b* and 123*c*, and may cover, for example, at least a portion of each of an upper surface and a side surface of a third-second wiring layer 123*b* and a front surface and a side surface of the electronic component 140. The third insulating film 153 may cover at least one of the plurality of third insulating layers 113*a*, 113*b* and 113*c*, for example, at least one of a lower surface of a third-second insulating layer 113*b* and at least one of the plurality of fourth wiring layers 124*a*, 124*b* and 124*c*, and may cover, for example, at least a portion of each of a lower surface and a side surface of a fourth-second wiring layer 124*b*. At least one other of the plurality of second insulating layers 112*a*, 112*b* and 112*c*, for example, a second-third insulating layer 112*c*, may cover at least a portion of the first insulating film 151. At least one other of the plurality of third insulating layers 113*a*, 113*b* and 113*c*, for example, a third-third insulating layer 113*c*, may cover at least a portion of the third insulating layer 153. Other contents are substantially the same as those described above, and thus, redundant descriptions thereof will be omitted.

FIGS. 8A to 8G are process cross-sectional views schematically illustrating an example embodiment of a manufacturing process of the printed circuit board of FIG. 7.

Figure 8A:
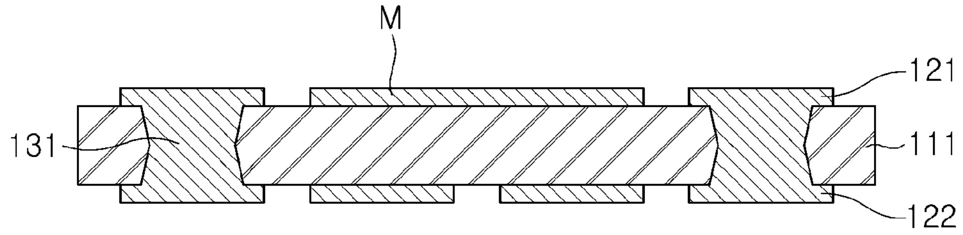
FIGS. 8A to 8G are process cross-sectional views schematically illustrating an example embodiment of a manufacturing process of the printed circuit board of FIG. 7.

Referring to FIG. 8A, a first insulating layer 111 is prepared using CCL, or the like, and first and second wiring layers 121 and 122 and a first via layer 131 are formed on the first insulating layer 111. A via hole for the first via layer 131 may be formed using mechanical drilling, laser processing, or the like. The first and second wiring layers 121 and 122 and the first via layer 131 may be formed through a circuit forming process such as AP, SAP, MSAP, or TT. The first wiring layer 121 may include a stopper layer M. The stopper layer M may be formed together in a circuit forming process.

Figure 8B:
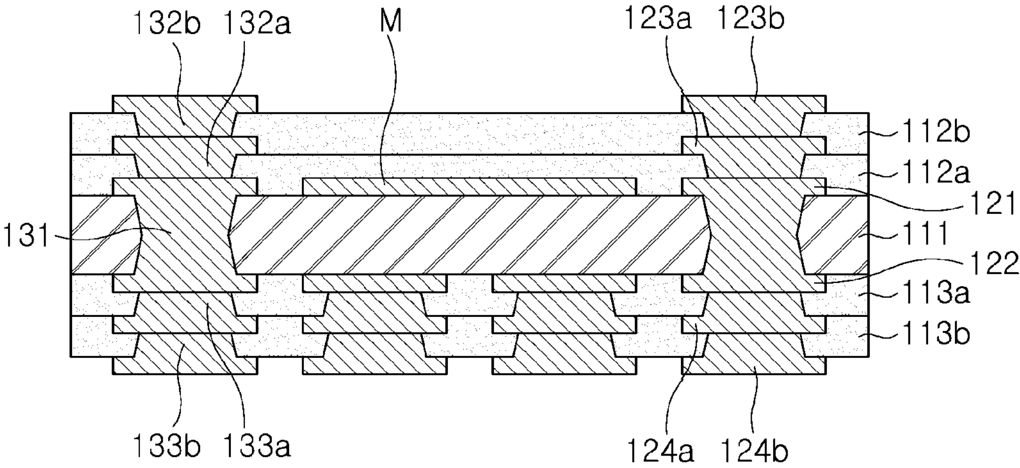

Referring to FIG. 8B, in a build-up process, second-first and second-second insulating layers 112*a* and 112*b* and third-first and third-second insulating layers 113*a* and 113*b*, third-first and third-second wiring layers 123*a* and 123*b* and fourth-first and fourth-second wiring layers 124*a* and 124*b*, and second-first and second-second via layers 132*a* and 132*b* and third-first and third-second via layers 133*a* and 133*b* are formed on both surfaces of the first insulating layer 111. The second-first and second-second insulating layers 112*a* and 112*b* may be formed in a lamination process, and the third-first and third-second wiring layers 123*a* and 123*b*, the fourth-first and fourth-second wiring layers 124*a* and 124*b*, the second-first and second-second via layers 132*a* and 132*b*, and the third-first and third-second via layers 133*a* and 133*b* may be formed in the circuit formation process described above. Via holes may be formed by mechanical drilling or laser processing.

Figure 8C:
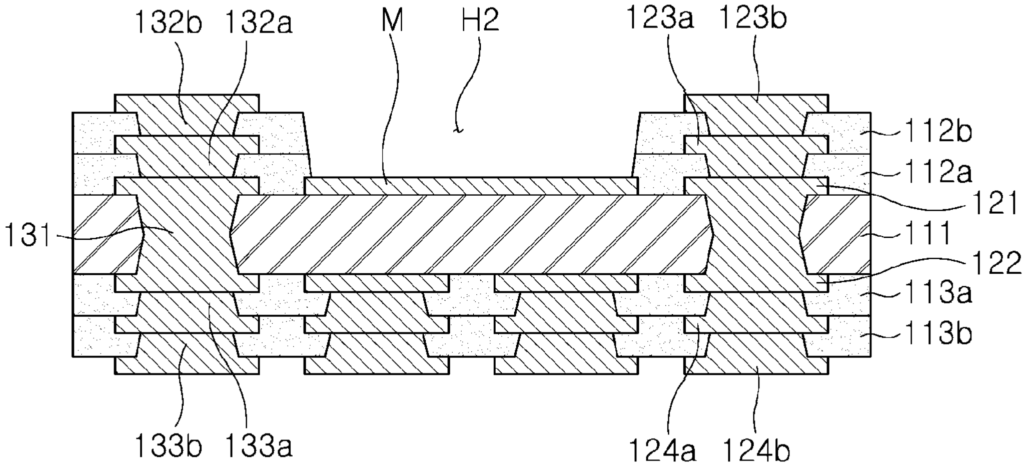

Referring to FIG. 8C, a blind cavity H2 is formed. The blind cavity H2 may be formed using the stopper layer M. For example, the blind cavity H2 may be formed by blast processing. However, the present disclosure is not limited thereto, and the blind cavity H2 may be formed by mechanical drilling, laser processing, or etching processes.

Figure 8D:
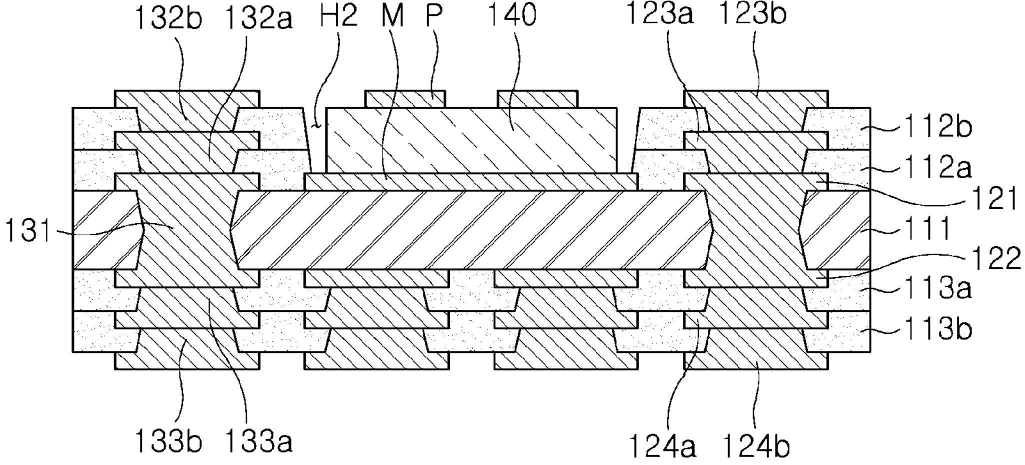

Referring to FIG. 8D, an electronic component 140 is disposed in the blind cavity H2. When the electronic component 140 is an active component, the electronic component 140 may be disposed in a face-up form so that a pad P faces upwardly. For example, a back surface of the electronic component 140 may be attached to an upper surface of the stopper layer M using an adhesive or the like.

Figure 8E:
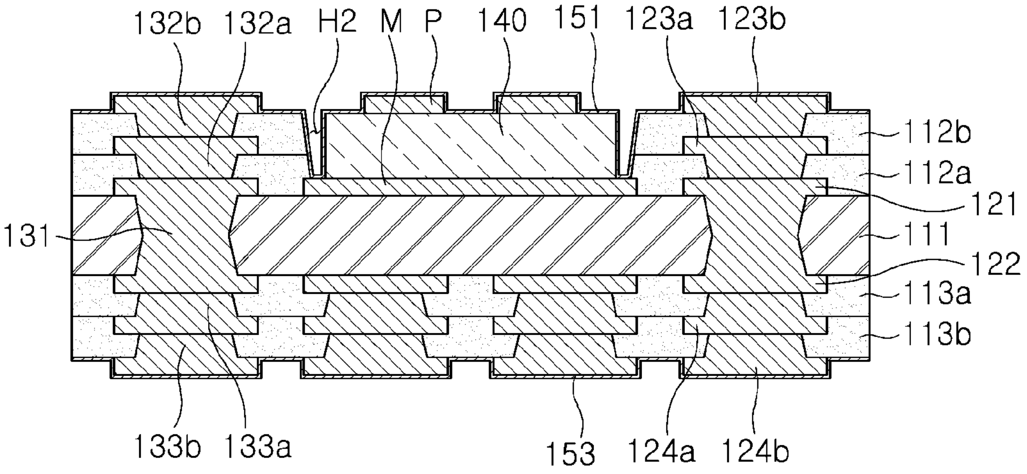

Referring to FIG. 8E, first and third insulating films 151 and 153 are formed. The first insulating film 151 may be formed to cover at least a portion of each of the second-second insulating layer 112*b*, the third-second wiring layer 123*b*, the electronic component 140, the pad P, the wall surface of the blind cavity H2, and the stopper layer M. The third insulating film 153 may cover at least a portion of each of the third-second insulating layer 113*b* and the fourth-second wiring layer 124*b*. The first and third insulating films 151 and 153 may be formed using a thin film deposition method such as ALD and MVD, respectively, as described above.

Figure 8F:
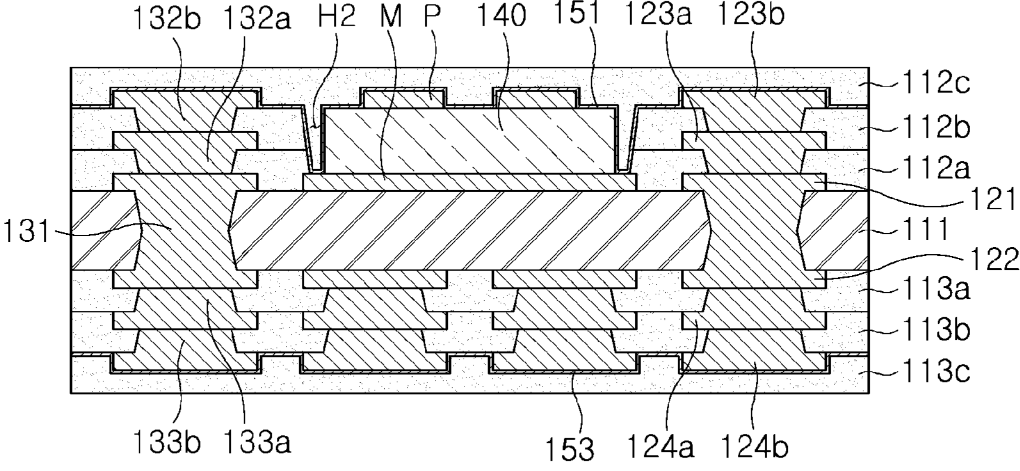

Referring to FIG. 8F, a second-third insulating layer 112*c* and a third-third insulating layer 113*c* are formed on the first and third insulating films 151 and 153, respectively. Each of the second-third insulating layer 112*c* and the third-third insulating layer 113*c* may be formed in the lamination process.

Figure 8G:
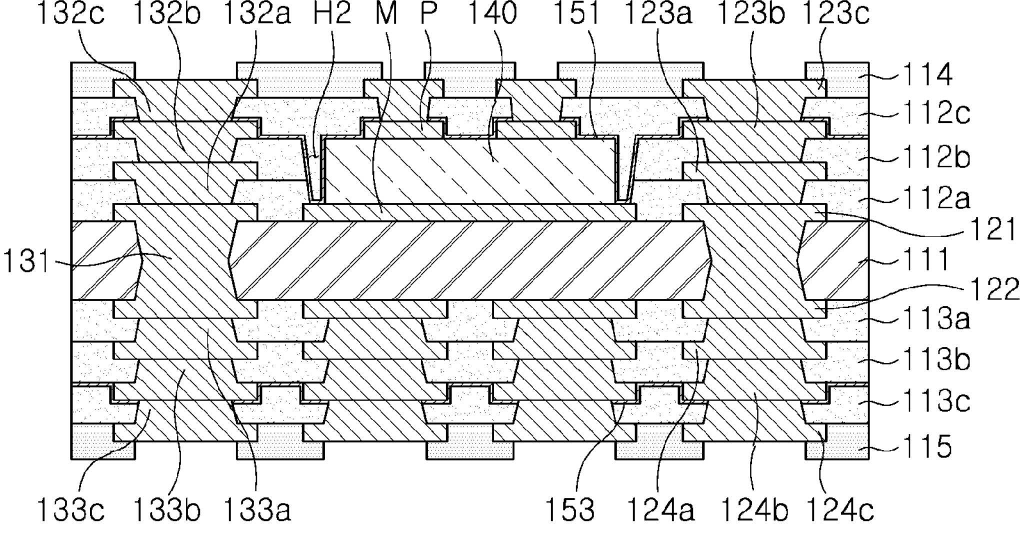

Referring to FIG. 8G, third-third and fourth-third wiring layers 123*c* and 124*c* and second-third and third-third via layers 132*c* and 133*c* are formed on the second-third insulating layer 112*c* and the third-third insulating layer 113*c*. Additionally, fourth and fifth insulating layers 114 and 115 are formed using a solder resist or ABF as an outermost layer, and if necessary, openings are formed in the fourth and fifth insulating layers 114 and 115, respectively. Via holes for the second-third and third-third via layers 132*c* and 133*c* may be formed using mechanical drilling, laser processing, or the like. The via holes for the second-third and third-third via layers 132*c* and 133*c* may penetrate through a portion of the first and third insulating films 151 and 153, respectively, and a portion of each of the third-second and fourth-second wiring layers 123*b* and 124*b* may be exposed from the first and third insulating films 151 and 153. Additionally, the via hole for the third-third via layer 133*c* may penetrate through another portion of the third insulating film 153, thus exposing a portion of the pad P from the third insulating film 153. The third-third and fourth-third wiring layers 123*c* and 124*c* and the second-third and third-third via layers 132*c* and 133*c* may be formed through the above-described circuit forming process such as AP, SAP, MSAP, TT or the like.

A printed circuit board 100C according to the above-described example embodiment may be manufactured in a series of processes, and other redundant descriptions thereof will be omitted.

In the present disclosure, determination may be performed by including process errors, positional deviations, errors at the time of measurement, which may occur substantially in a manufacturing process. For example, having a substantially specific value in a line width, an interval, a thickness, a height, and the like, may include having a value similar to that as well as having that value. Furthermore, being substantially coplanar may include not only a case of being completely coplanar, but also a case of being approximately coplanar.

In the present disclosure, the meaning on the cross-section may refer to a cross-sectional shape when an object is cut vertically, or a cross-sectional shape when the object is viewed in a side-view. Furthermore, the meaning on a plane may refer to a planar shape when the object is horizontally cut, or a planar shape when the object is viewed in a top-view or a bottom-view.

In the present disclosure, a lower side, a lower portion, and a lower surface are used to refer to a downward direction with respect to a cross-section of a drawing, and an upper side, an upper portion, and an upper surface are used to refer to an opposite direction thereof. However, this defines the direction for convenience of explanation, and the scope of the rights of the claims is not particularly limited by the description of such a direction, and the concept of upper and lower portions may be changed at any time.

In the present disclosure, a meaning of being connected is a concept including not only directly connected but also indirectly connected through an adhesive layer or the like. Furthermore, a meaning of electrically connected is a concept including both physically connected and not connected. In addition, expressions such as first and second are used to distinguish one component from another, and do not limit the order and/or importance of the components. In some cases, a first component may be referred to as a second component without departing from the scope of rights, or similarly, the second component may be referred to as the first component.

The expression 'example embodiment used in the present disclosure' does not mean the same embodiment, and is provided to explain different unique characteristics. However, the example embodiments presented above do not preclude being implemented in combination with features of other example embodiments. For example, even if matters described in a particular example embodiment are not described in other example embodiments, they may be understood as explanations related to other example embodiments unless there is an explanation contrary to or contradictory to matters in other example embodiments.

The terms used in the present disclosure are used only to describe an example embodiment and are not intended to limit the present disclosure. In this case, singular expressions include plural expressions unless they are clearly meant differently in the context.

While example embodiments have been illustrated and described above, it will be apparent to those skilled in the art that modifications and variations could be made without departing from the scope of the present disclosure as defined by the appended claims.

What is claimed is:

1. A printed circuit board, comprising:

a plurality of insulating layers including a first insulating layer and a second insulating layer and having a through-portion penetrating at least a portion of the first insulating layer;

a plurality of wiring layers respectively disposed on or in the plurality of insulating layers;

a plurality of via layers respectively penetrating through at least a portion of at least one of the plurality of insulating layers and respectively connected to at least one of the plurality of wiring layers;

an electronic component at least partially disposed in the through-portion, and embedded in at least one of the plurality of insulating layers; and an insulating film disposed between the first insulating layer and the second insulating layer to cover at least a portion of a side surface of the electronic component and at least a portion of a wall surface of the through-portion, wherein the second insulating layer includes a portion covering a portion of the insulating film on the first insulating layer, and another portion disposed in the through-portion to cover another portion of the insulating film in the through-portion.

2. The printed circuit board according to claim 1, wherein the insulating film covers at least the portion of the side surface of the electronic component and at least the portion of the wall surface of the through-portion, with a substantially constant thickness.

3. The printed circuit board according to claim 2, wherein the insulating film includes an oxide film having a thickness of less than 100 nm.

4. The printed circuit board according to claim 3, wherein the oxide film includes at least one of $Al_2O_3$, $TiO_2$, ZnO, and $SiO_2$.

5. The printed circuit board according to claim 1, wherein the electronic component has a front surface on which a pad is disposed, and a back surface opposite thereto, and the insulating film further covers at least a portion of the front surface of the electronic component.

6. The printed circuit board according to claim 5, wherein the insulating film further covers at least a portion of the back surface of the electronic component.

7. The printed circuit board according to claim 1, wherein the insulating film further covers at least a portion of at least one of the plurality of wiring layers.

8. The printed circuit board according to claim 7, wherein the insulating film is in contact with at least a portion of at least one of the plurality of via layers.

9. The printed circuit board according to claim 1, wherein the plurality of insulating layers further includes a third insulating layer disposed on a lower surface of the second insulating layer, the plurality of wiring layers include first and second wiring layers respectively disposed on an upper surface and a lower surface of the first insulating layer, a third wiring layer disposed on an upper surface of the second insulating layer, and a fourth wiring layer disposed on a lower surface of the third insulating layer, the plurality of via layers includes a first via layer penetrating through at least a portion of the first insulating layer, a second via layer penetrating through at least a portion of the second insulating layer, and a third via layer penetrating through at least a portion of the third insulating layer, and the through-portion includes a through-cavity penetrating through the first insulating layer.

10. The printed circuit board according to claim 9, wherein a front surface of the electronic component faces downwardly, the insulating film includes first and second insulating films connected to each other, the first insulating film covers at least a portion of each of the upper surface and the lower surface of the first insulating layer, a wall surface of the through-cavity, an upper surface and a side surface of the first wiring layer, a side surface of the second wiring layer, and the front surface, a back surface and a side surface of the electronic component, the second insulating film covers at least a portion of each of the lower surface of the second insulating layer and a lower surface of the second wiring layer, the second insulating layer covers at least a portion of the first insulating film, and the third insulating layer covers at least a portion of the second insulating film.

11. The printed circuit board according to claim 9, wherein a front surface of the electronic component faces upwardly, the insulating film covers at least a portion of each of the upper surface and the lower surface of the first insulating layer, the wall surface of the through-cavity, an upper surface and a side surface of the first wiring layer, a side surfaces of the second wiring layer, and the front surface and a side surface of the electronic component.

12. The printed circuit board according to claim 1, wherein the plurality of insulating layers further include third insulating layer disposed on a lower surface of the first insulating layer, the plurality of wiring layers include first and second wiring layers respectively disposed on an upper surface and the lower surface of the first insulating layer, a third wiring layer disposed on the second insulating layer, and a fourth wiring layer disposed on the third insulating layer, the plurality of via layers include a first via layer penetrating through at least a portion of the first insulating layer, a second via layer penetrating through the second insulating layer, and a third via layer penetrating through the third insulating layer, and the through-portion includes a blind cavity penetrating through the second insulating layer.

13. The printed circuit board according to claim 12, wherein a front surface of the electronic component faces upwardly, the insulating film includes first and third insulating films spaced apart from each other, the first insulating film covers at least a portion of an upper surface of the second insulating layer, a wall surface of the blind cavity, at least one upper surface and side surface of the third wiring layer, and a front surface and a side surface of the electronic component, the third insulating film covers at least a portion of a lower surface of the third insulating layer, and a lower surface and a side surface of the fourth wiring layer, and the printed circuit board further comprises other second-insulating layers respectively covering at least a portion of the first insulating film at least a portion of the third insulating film.

14. The printed circuit board according to claim 13, wherein the first wiring layer includes a stopper layer as a bottom surface of the blind cavity, a back surface of the electronic component is attached to the stopper layer, the first insulating layer further covers at least a portion of an upper surface of the stopper layer.

15. The printed circuit board according to claim 1, wherein the insulating film is thinner than each of the plurality of insulating layers and each of the plurality of wiring layers, and includes a material different from the plurality of insulating layers.

16. A printed circuit board, comprising:

a plurality of insulating layers;

a plurality of wiring layers respectively disposed on or in the plurality of insulating layers;

a plurality of via layers respectively penetrating through at least a portion of at least one of the plurality of insulating layers and respectively connected to at least one of the plurality of wiring layers;

an electronic component disposed in the plurality of insulating layers; and an insulating film disposed in the plurality of insulating layers and covering at least a portion of at least one portion of the plurality of wiring layers and at least a portion of the electronic component, wherein the insulating film covers only a portion of a side surface of one of the plurality of via layers which extends from the at least one portion of the plurality of wiring layers.

17. The printed circuit board according to claim 16, wherein the insulating film is disposed between at least one of the plurality of insulating layers and at least one of the plurality of wiring layers, and between at least one of the plurality of insulating layers and the electronic component, with a substantially constant thickness.

18. The printed circuit board according to claim 17, wherein the insulating film includes an alumina film.

19. The printed circuit board according to claim 18, wherein the alumina film has a thickness of less than 100 nm.

20. The printed circuit board according to claim 16, wherein the insulating film is thinner than each of the plurality of insulating layers and each of the plurality of wiring layers, and includes a material different from the plurality of insulating layers.

* * * * *